United States Patent
Hidaka

(10) Patent No.: US 8,730,370 B2
(45) Date of Patent: May 20, 2014

(54) SOLID-STATE IMAGING DEVICE HAVING IMAGE PIXEL POSITION CORRECTION TO REDUCE SHAPE DISTORTION

(75) Inventor: Kiyoshi Hidaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

(21) Appl. No.: 13/023,825

(22) Filed: Feb. 9, 2011

(65) Prior Publication Data

US 2011/0234860 A1 Sep. 29, 2011

(30) Foreign Application Priority Data

Mar. 25, 2010 (JP) ................. 2010-069345

(51) Int. Cl.
*H04N 5/225* (2006.01)
*H04N 3/26* (2006.01)

(52) U.S. Cl.
USPC .......................................... 348/340; 348/745

(58) Field of Classification Search
USPC ............ 348/207.99, 186–190, 222.1, 208.99, 348/241, 14.14, 340, 345, 335, 246, 745
See application file for complete search history.

(56) References Cited

U.S. PATENT DOCUMENTS

| | | | |
|---|---|---|---|
| 6,816,187 B1 | 11/2004 | Iwai et al. | |
| 6,836,298 B2 * | 12/2004 | Song et al. | 348/745 |
| 7,055,958 B2 * | 6/2006 | Tajima | 353/69 |
| 8,126,286 B2 * | 2/2012 | Imai | 382/275 |
| 2005/0213847 A1 * | 9/2005 | Takane | 382/275 |
| 2009/0245682 A1 | 10/2009 | Imai | |

FOREIGN PATENT DOCUMENTS

| | | |
|---|---|---|
| JP | 2000-350239 | 12/2000 |
| JP | 2003-78811 A | 3/2003 |
| JP | 2004-128730 | 4/2004 |
| JP | 2005-101831 | 4/2005 |
| JP | 2009-49862 | 3/2009 |
| WO | WO 2009/141998 A1 | 11/2009 |

OTHER PUBLICATIONS

Japanese Office Action issued May 15, 2012, in Japan Patent Application No. 2010-069345 (with English translation).
U.S. Appl. No. 13/049,455, filed Mar. 16, 2011, Ogasahara.
Combined Chinese Office Action and Search Report issued May 6, 2013 in Patent Application No. 201110051981.9 with English Translation and English Translation of Category of Cited Documents.

* cited by examiner

*Primary Examiner* — Ahmed A Berhan

(74) *Attorney, Agent, or Firm* — Oblon, Spivak, McClelland, Maier & Neustadt, L.L.P.

(57) ABSTRACT

According to one embodiment, a correction-parameter storing unit corrects a position of a captured image captured by an image sensor, and an image-position correcting unit corrects the position of the captured image for each pixel based on the correction parameter.

10 Claims, 15 Drawing Sheets

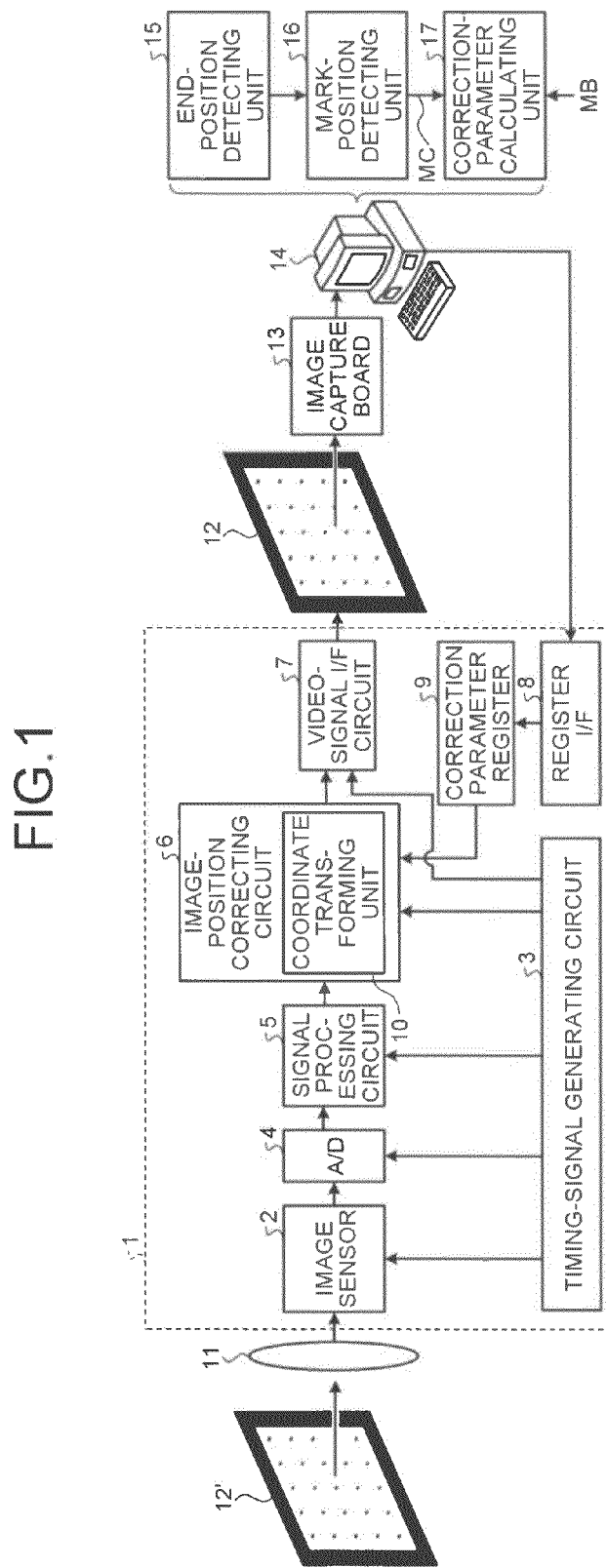

SOLID-STATE IMAGING DEVICE HAVING IMAGE PIXEL POSITION CORRECTION TO REDUCE SHAPE DISTORTION

CROSS-REFERENCE TO RELATED APPLICATIONS

This application is based upon and claims the benefit of priority from the prior Japanese Patent Application No. 2010-69345, filed on Mar. 25, 2010; the entire contents of which are incorporated herein by reference.

FIELD

Embodiments described herein relate generally to a solid-state imaging device.

BACKGROUND

In solid-state imaging devices, an image sensor and a lens are integrated by fixing the lens to a mirror tube in which the image sensor is arranged and thereby modularizing the image sensor and the lens.

With this method, when the image sensor and the lens are modularized, deviation, distortion, or the like occurs in some cases in an image output from the solid-state imaging device due to a manufacturing variation of the lens or the mirror tube, distortion of the lens and variation in attachment position of the lens, or the like.

Moreover, for enabling to visually and quantitatively recognize a shape distortion of a projected image projected from a projector at a high accuracy, there is a method in which a chart image for correcting the shape distortion of the projected image is generated, the chart image is projected by the projector, the projected image projected from the projector is captured, coordinates of a captured sensing image are obtained by performing analysis of the sensing image, and a blended image in which the analyzed sensing image and the chart image are blended is displayed by the projector.

With this method, although the shape distortion of the projected image projected from the projector can be visually recognized, deviation, distortion, and the like of the projected image projected from the projector cannot be corrected.

BRIEF DESCRIPTION OF THE DRAWINGS

FIG. 1 is a block diagram illustrating a schematic configuration of a solid-state imaging device according to a first embodiment;

DETAILED DESCRIPTION

Figure 2A:
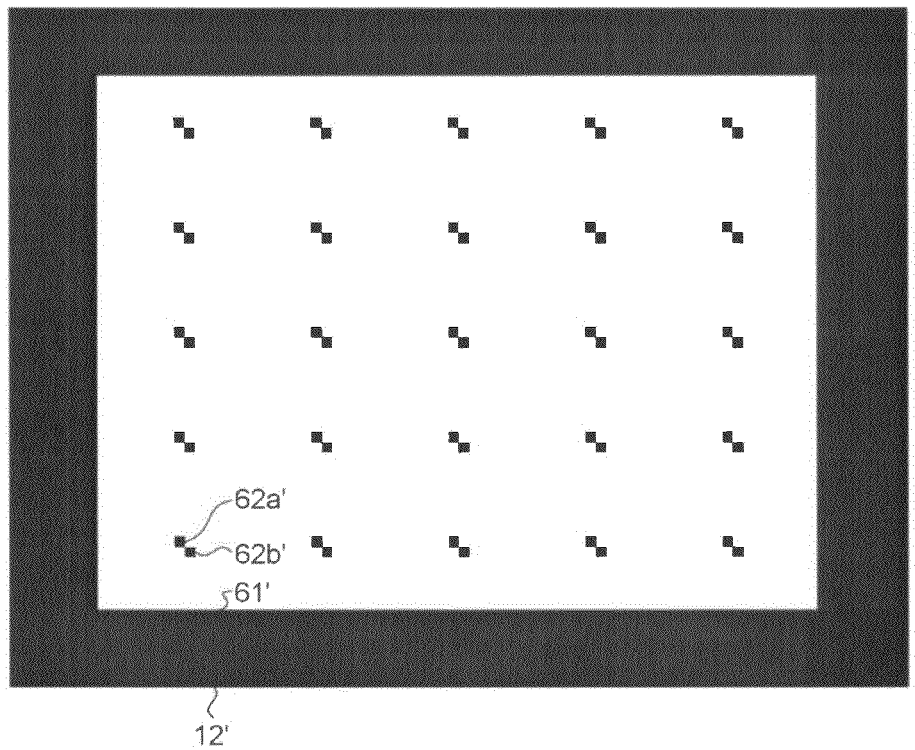
FIG. 2A is a plan view illustrating an example of a schematic configuration of a test chart in FIG. 1.

In general, according to one embodiment, an image sensor, a correction-parameter storing unit, and an image-position correcting unit are included. The image sensor captures an image. The correction-parameter storing unit stores therein a correction parameter with which a position of a captured image captured by the image sensor is corrected for each pixel. The image-position correcting unit corrects the position of the captured image for each pixel based on the correction parameter.

Exemplary embodiments of a solid-state imaging device will be explained below in detail with reference to the accompanying drawings. The present invention is not limited to the following embodiments.

(First Embodiment)

FIG. 1 is a block diagram illustrating a schematic configuration of a solid-state imaging device according to the first embodiment.

In FIG. 1, a solid-state imaging device 1 includes an image sensor 2, a timing-signal generating circuit 3, an A/D converter 4, a signal processing circuit 5, an image-position correcting circuit 6, a video-signal interface circuit 7, a register interface 8, and a correction parameter register 9.

The image sensor 2 can capture an image and is provided with a pixel array portion in which pixels are arranged in a matrix manner. The timing-signal generating circuit 3 can generate a timing signal so that the image sensor 2, the A/D converter 4, the signal processing circuit 5, the image-position correcting circuit 6, and the video-signal interface circuit 7 can operate in a cooperative manner. The A/D converter 4 can digitalize a captured signal output from the image sensor 2. The signal processing circuit 5 can perform signal processing on the captured signal digitalized in the A/D converter 4. The image-position correcting circuit 6 can correct a position of a captured image for each pixel based on a correction parameter stored in the correction parameter register 9. The video-signal interface circuit 7 can exchange a video signal between the solid-state imaging device 1 and the outside. The register interface 8 can exchange the correction parameter between the solid-state imaging device 1 and the outside. The correction parameter register 9 can store therein the correction parameter used in the image-position correcting circuit 6.

The correction parameter can be set to eliminate deviation between a pattern of a captured image captured by the image sensor 2 and a pattern of a capturing target to be captured by the image sensor 2. For example, coordinates of the pattern of the captured image captured by the image sensor 2 can be set to match coordinates of the pattern of the capturing target to be captured by the image sensor 2.

In the image-position correcting circuit 6, a coordinate transforming unit 10 that perform a coordinate transformation on a position of a captured image for each pixel based on the correction parameter is provided. As the coordinate transformation in the coordinate transforming unit 10, for example, an affine transformation or a projective transformation can be used.

Moreover, a lens 11 that makes light to enter the image sensor 2 is arranged in front of the image sensor 2. In the embodiment in FIG. 1, the method is explained in which the lens 11 is provided separately from the solid-state imaging device 1; however, the lens 11 can be provided in the solid-state imaging device 1.

In the case of storing the correction parameter in the correction parameter register 9, a test chart 12' is captured by the solid-state imaging device 1 in a state where the video-signal interface circuit 7 is connected to the input terminal of a personal computer 14 via an image capture board 13 and the output terminal of the personal computer 14 is connected to the register interface 8.

Figure 2B:
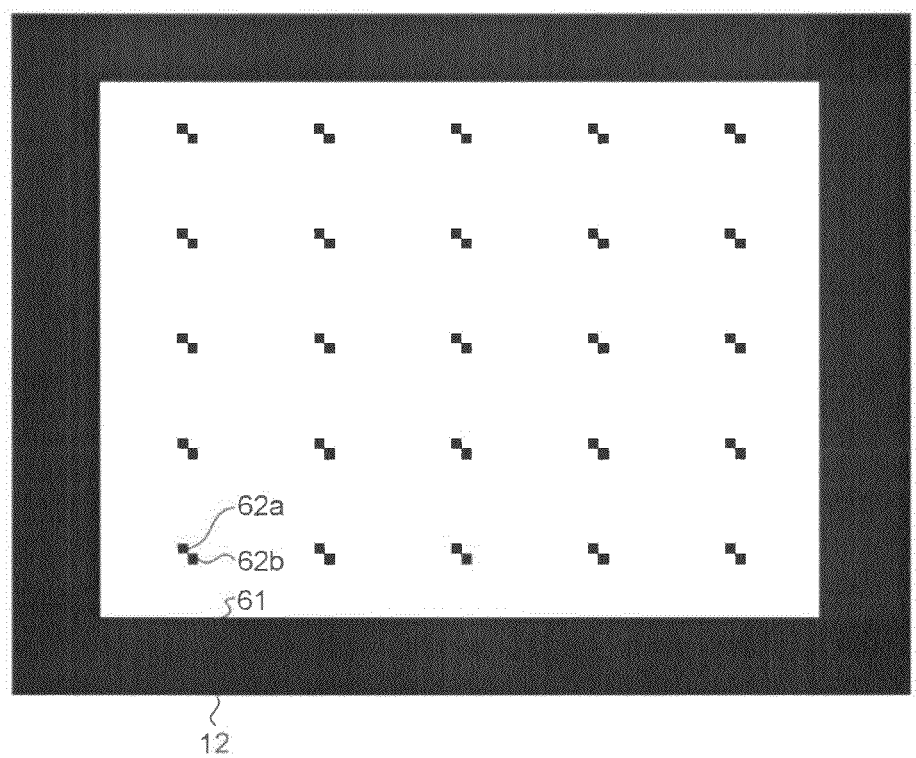
FIG. 2B is a plan view illustrating an example of a captured image of the test chart in FIG. 1.

FIG. 2A is a plan view illustrating an example of the schematic configuration of the test chart in FIG. 1, and FIG. 2B is a plan view illustrating an example of a captured image 12 of the test chart in FIG. 1. In FIG. 2A, in the test chart 12', an outer frame pattern 61' and marks in each of which a first pattern 62a' and a second pattern 62b' are paired are provided. The outer frame pattern 61' can be arranged on the periphery in the test chart 12' and formed into a rectangular shape.

The first pattern 62a' can be configured to include a pixel adjacent at least in three directions. The second pattern 62b' can have a shape point-symmetrical to the first pattern 62a'. The first pattern 62a' can have a polygonal shape such as a triangle and a quadrilateral or a circle or an ellipse. Moreover, the first pattern 62a' and the second pattern 62b' can be in contact with each other or separated from each other. The first pattern 62a' and the second pattern 62b' can be different from each other so long as the shapes thereof are point-symmetrical to each other.

Moreover, the marks in each of which the first pattern 62a' and the second pattern 62b' are paired can be arranged in a lateral direction and a longitudinal direction with predetermined intervals inside the outer frame pattern 61'. In the example in FIG. 2A and FIG. 2B, five marks are arranged in each of the lateral direction and the longitudinal direction and therefore 25 marks are arranged in the test chart 12'.

On the other hand, in FIG. 2B, when the test chart 12' in FIG. 2A is captured by the solid-state imaging device 1, the captured image 12 is output from the solid-state imaging device 1. In the captured image 12, captured patterns 61, 62a, and 62b are formed corresponding to the outer frame pattern 61', the first pattern 62a', and the second pattern 62b' of the test chart 12', respectively.

In the captured patterns 61, 62a, and 62b, deviation, distortion, and the like occur due to distortion of the lens 11, variation in attachment position of the lens 11, and the like.

Moreover, when blur occurs in the captured image 12, concentration gradually decreases from inside to outside at boundaries of the captured patterns 61, 62a, and 62b.

Moreover, in the personal computer 14 in FIG. 1, an end-position detecting unit 15, a mark-position detecting unit 16, and a correction-parameter calculating unit 17 are provided. The end-position detecting unit 15 can detect the end position of the captured image 12 by referring to the captured pattern 61 of the captured image 12. The mark-position detecting unit 16 can detect mark positions by referring to the captured patterns 62a and 62b. The correction-parameter calculating unit 17 can calculate the correction parameter based on the mark positions of the test chart 12' and the mark positions of the captured image 12. It is applicable that the correction-parameter calculating unit 17 pre-stores therein the mark positions of the test chart 12'.

The end-position detecting unit 15, the mark-position detecting unit 16, and the correction-parameter calculating unit 17 can be realized by a computer program. In the case of storing the correction parameter in the correction parameter register 9, the computer program that realizes the end-position detecting unit 15, the mark-position detecting unit 16, and the correction-parameter calculating unit 17 can be installed in the personal computer 14.

When the test chart 12' is captured by the solid-state imaging device 1, the captured image 12 of the test chart 12' passes the image-position correcting circuit 6 and is sent to the image capture board 13 via the video-signal interface circuit 7. Then, the captured image 12 sent to the image capture board 13 is held in the image capture board 13 and is sent to the personal computer 14.

Then, after the end positions of the captured image 12 are detected by referring to the captured pattern 61 in the end-position detecting unit 15, mark positions are detected by referring to the captured patterns 62a and 62b in the mark-position detecting unit 16.

Then, in the correction-parameter calculating unit 17, the correction parameter is calculated based on the mark positions of the test chart 12' and the mark positions of the captured image 12 and the correction parameter is sent to the correction parameter register 9 via the register interface 8 to be stored in the correction parameter register 9.

For example, the coordinate transformation in the coordinate transforming unit 10 is the affine transformation. In this case, the correction parameter can be expressed by an affine transformation matrix MA as illustrated below and elements a to f of this affine transformation matrix MA can be stored in the correction parameter register 9.

Moreover, in the correction-parameter calculating unit 17, a coordinate matrix MC can be input as the mark positions of the test chart 12' and a coordinate matrix MB can be input as the mark positions of the captured image 12. The coordinate matrix MB can be calculated in the mark-position detecting unit 16 by referring to the captured patterns 62a and 62b.

$$MA = \begin{pmatrix} a & b & c \\ d & e & f \\ 0 & 0 & 1 \end{pmatrix}$$

$$MB = \begin{pmatrix} X_0 & X_1 & \sim & X_{24} \\ Y_0 & Y_1 & \sim & Y_{24} \\ 1 & 1 & \sim & 1 \end{pmatrix}$$

$$MC = \begin{pmatrix} X'_0 & X'_1 & \sim & X'_{24} \\ Y'_0 & Y'_1 & \sim & Y'_{24} \\ 1 & 1 & \sim & 1 \end{pmatrix}$$

As shown in FIG. 2A, if 25 marks are provided in the test chart 12', $X_0$ to $X_{24}$ indicate an X coordinate of the marks of the captured image 12, $Y_0$ to $Y_{24}$ indicate a Y coordinate of the marks of the captured image 12, $X_0'$ to $X_{24}'$ indicate an X coordinate of the marks of the test chart 12', and $Y_0'$ to $Y_{24}'$ indicate a Y coordinate of the marks of the test chart 12'.

When the coordinate matrices MB and MC are input to the correction-parameter calculating unit 17, the affine transformation matrix MA can be obtained as the correction parameter by performing calculations in the following equation (1) to equation (4).

$$\begin{pmatrix} a & b & c \\ d & e & f \\ 0 & 0 & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix} = \begin{pmatrix} X'_0 & X'_1 & \sim & X'_{24} \\ Y'_0 & Y'_1 & \sim & Y'_{24} \\ 1 & 1 & \sim & 1 \end{pmatrix} \quad (1)$$

$$\begin{pmatrix} a & b & c \\ d & e & f \\ 0 & 0 & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T = \quad (2)$$

$$\begin{pmatrix} X'_0 & X'_1 & \sim & X'_{24} \\ Y'_0 & Y'_1 & \sim & Y'_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T$$

$$\begin{pmatrix} a & b & c \\ d & e & f \\ 0 & 0 & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T \quad (3)$$

$$\left( \begin{pmatrix} X_0 & X_1 & \sim & X_{24} \\ Y_0 & Y_1 & \sim & Y_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T \right)^{-1} =$$

$$\begin{pmatrix} X'_0 & X'_1 & \sim & X'_{24} \\ Y'_0 & Y'_1 & \sim & Y'_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T$$

$$\left( \begin{pmatrix} X_0 & X_1 & \sim & X_{24} \\ Y_0 & Y_1 & \sim & Y_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T \right)^{-1}$$

$$\begin{pmatrix} a & b & c \\ d & e & f \\ 0 & 0 & 1 \end{pmatrix} \begin{pmatrix} 1 & 0 & 0 \\ 0 & 1 & 0 \\ 0 & 0 & 1 \end{pmatrix} = \begin{pmatrix} X'_0 & X'_1 & \sim & X'_{24} \\ Y'_0 & Y'_1 & \sim & Y'_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T \quad (4)$$

$$\left( \begin{pmatrix} X_0 & X_1 & \sim & X_{24} \\ Y_0 & Y_1 & \sim & Y_{24} \\ 1 & 1 & \sim & 1 \end{pmatrix} \begin{pmatrix} X_0 & X_1 & \sim & X_{24} \\ Y_0 & Y_1 & \sim & Y_{24} \\ 1 & 1 & \sim & 1 \end{pmatrix}^T \right)^{-1}$$

$$\begin{pmatrix} a & b & c \\ d & e & f \\ 0 & 0 & 1 \end{pmatrix} \begin{pmatrix} x \\ y \\ 1 \end{pmatrix} = \begin{pmatrix} x' \\ y' \\ 1 \end{pmatrix} \quad (5)$$

where T indicates a transposed matrix and −1 indicates an inverse matrix.

As the correction parameter, a projective transformation matrix MD as illustrated below can be used other than the affine transformation matrix MA.

$$MD = \begin{pmatrix} a & b & c \\ d & e & f \\ g & h & 1 \end{pmatrix}$$

When the correction parameter is stored in the correction parameter register 9, the image capture board 13 and the personal computer 14 are detached from the solid-state imaging device 1. Then, when an object is captured by the solid-state imaging device 1, the captured image of the object is sent to the image-position correcting circuit 6. Then, the coordinates of the pixels of the captured image are transformed in accordance with the correction parameter stored in the correction parameter register 9, so that the positions of the pixels of the captured image are corrected and the corrected captured image is output via the video-signal interface circuit 7.

For example, when the mark positions of the test chart 12' are expressed by the coordinate matrix MC, the positions of 25 pixels of the captured image corresponding to the mark positions of the test chart 12' can be expressed by the coordinate matrix MB and are corrected in accordance with equation (1). Moreover, arbitrary coordinates (x,y) of the captured image are corrected to coordinates (x',y') in accordance with equation (5). At this time, the corrected coordinates often become a value other than an integer and some coordinates become blank, so that interpolation processing needs to be performed to fill in all coordinates after correction.

Consequently, deviation, distortion, and the like of a captured image output from the solid-state imaging device 1 can be corrected, so that even when there is distortion of the lens 11, variation in attachment position of the lens 11, or the like, deterioration in quality of a captured image can be reduced.

The number of pixels of a captured image that can be accurately corrected by performing the affine transformation matrix MA is increased by increasing the number of the marks of the test chart 12', so that the correction accuracy of the whole captured image can be improved. However, if the number of the marks of the test chart 12' is increased, the processing time increases, so that the number of the marks of the test chart 12' is preferably set to satisfy both of the processing time and the correction accuracy.

FIG. 3A to FIG. 3H are diagrams illustrating other examples of the mark used in the test chart in FIG. 1.

Figure 3A:
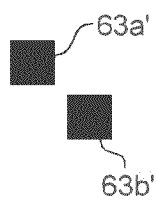
FIG. 3A to FIG. 3H are diagrams illustrating other examples of a mark used in the test chart in FIG. 1.

As shown in FIG. 3A, it is applicable that a first pattern 63a' and a second pattern 63b' are formed into a square and the first pattern 63a' and the second pattern 63b' are separated from each other.

Figure 3B:
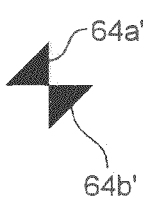

As shown in FIG. 3B, it is applicable that a first pattern 64a' and a second pattern 64b' are formed into a triangle and the first pattern 64a' and the second pattern 64b' are in contact with each other at one point.

Figure 3C:
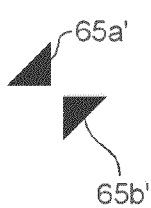

As shown in FIG. 3C, it is applicable that a first pattern 65a' and a second pattern 65b' are formed into a triangle and the first pattern 65a' and the second pattern 65b' are separated from each other.

Figure 3D:
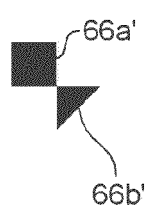

As shown in FIG. 3D, it is applicable that a first pattern 66a' is formed into a square and a second pattern 66b' is formed into a triangle, and the first pattern 66a' and the second pattern 66b' are in contact with each other at one point.

Figure 3E:
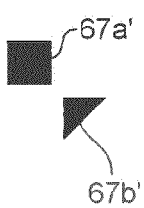

As shown in FIG. 3E, it is applicable that a first pattern 67a' is formed into a square and a second pattern 67b' is formed into a triangle, and the first pattern 67a' and the second pattern 67b' are separated from each other.

Figure 3F:
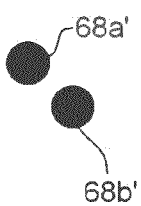

As shown in FIG. 3F, it is applicable that a first pattern 68a' and a second pattern 68b' are formed into a circle, the first pattern 68a' and the second pattern 68b' are made adjacent to each other in a left oblique direction, and the first pattern 68a' and the second pattern 68b' are separated from each other.

Figure 3G:
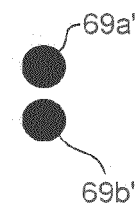

As shown in FIG. 3G, it is applicable that a first pattern 69a' and a second pattern 69b' are formed into a circle, the first pattern 69a' and the second pattern 69b' are made adjacent to each other in a longitudinal direction, and the first pattern 69a' and the second pattern 69b' are separated from each other.

Figure 3H:
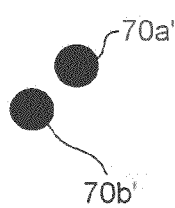

As shown in FIG. 3H, it is applicable that a first pattern 70a' and a second pattern 70b' are formed into a circle, the first pattern 70a' and the second pattern 70b' are made adjacent to each other in a right oblique direction, and the first pattern 70a' and the second pattern 70b' are separated from each other.

Figure 4:
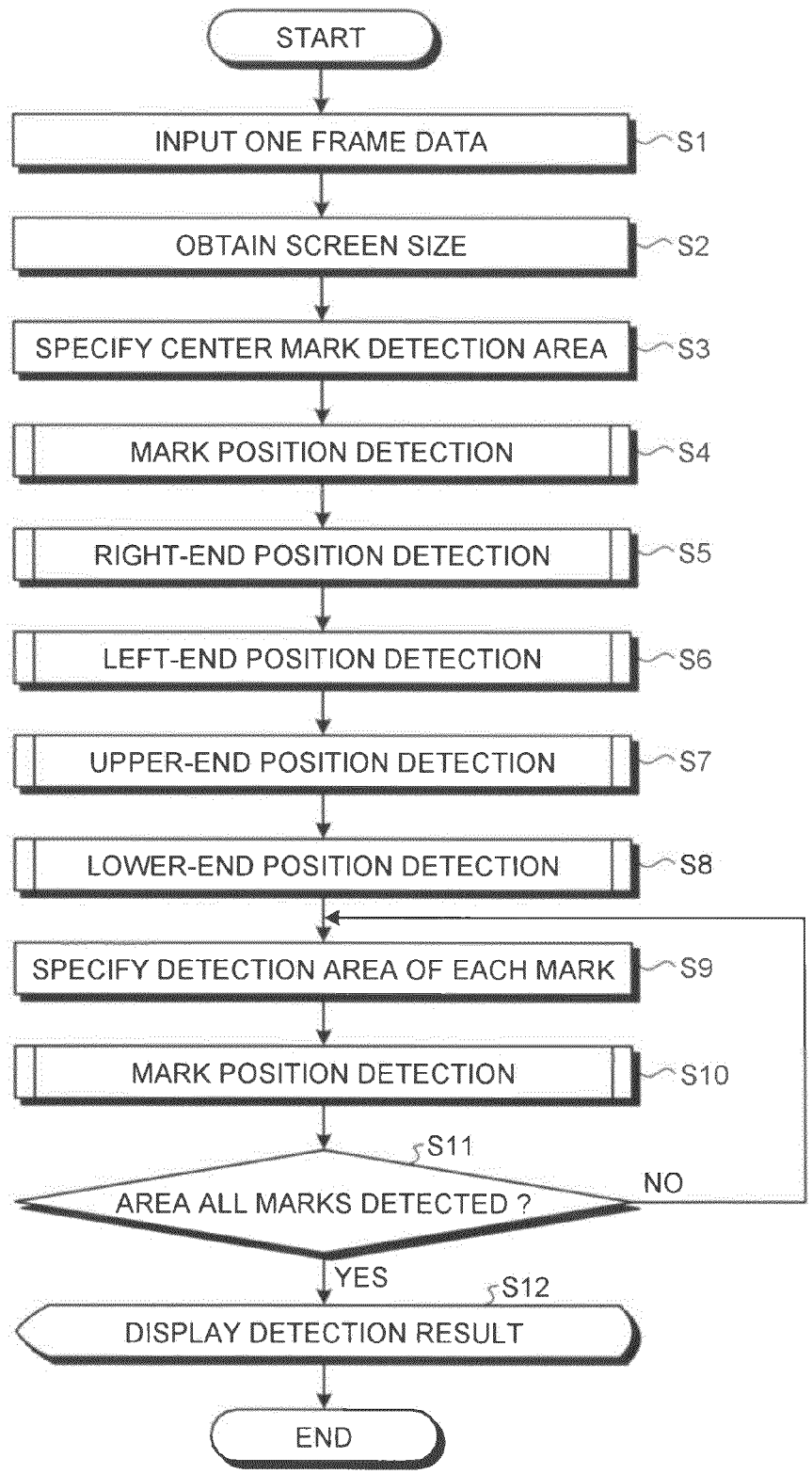
FIG. 4 is a flowchart illustrating a mark position detecting method performed in a personal computer in FIG. 1.
Figure 5:
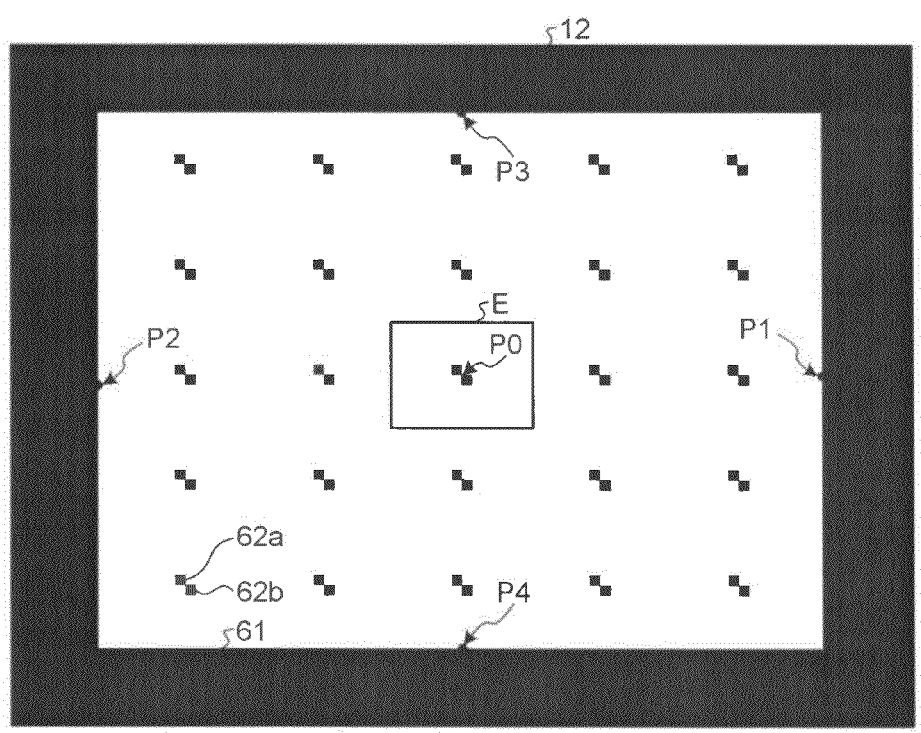
FIG. 5 is a plan view illustrating a detection position of a captured image of the test chart in FIG. 2A and FIG. 2B.

FIG. 4 is a flowchart illustrating a mark position detecting method performed in the personal computer 14 in FIG. 1, and FIG. 5 is a plan view illustrating a detection position of a captured image of the test chart in FIG. 2.

In FIG. 4 and FIG. 5, when the captured image 12 of the test chart 12' is obtained as data for one frame (Step S1), a detection area E of a center mark is specified from a screen size (Steps S2 and S3). The detection area E is preferably specified so that a mark at the center of the captured image 12 is included and marks other than that are not included.

Next, a mark position PO of the center mark is detected by referring to the captured patterns 62a and 62b of the detection area E (Step S4). The mark position PO can be set to correspond to a position of a pixel with respect to which the captured patterns 62a and 62b are point symmetrical.

Next, a right end position P1 is detected by searching for a point at which the center mark hits the captured pattern 61 when moving toward the right side from the mark position PO of the center mark (Step S5).

Next, a left end position P2 is detected by searching for a point at which the center mark hits the captured pattern 61 when moving toward the left side from the mark position PO of the center mark (Step S6).

Next, an upper end position P3 is detected by searching for a point at which the center mark hits the captured pattern 61 when moving toward the upper side from the mark position PO of the center mark (Step S7).

Next, a lower end position P4 is detected by searching for a point at which the center mark hits the captured pattern 61 when moving toward the lower side from the mark position PO of the center mark (Step S8).

Next, the inside of the captured pattern 61 is divided into 25 areas based on the right end position P1, the left end position P2, the upper end position P3, and the lower end position P4 to partition the inside of the captured pattern 61. Then, the detection area of each mark is set so that one detection area includes one mark in the partitioned areas.

Then, the mark positions of all marks included in the captured image 12 are detected by referring to the captured patterns 62a and 62b of each detection area (Steps S9 to S11) and the detection result thereof is displayed (Step S12).

Figure 6:
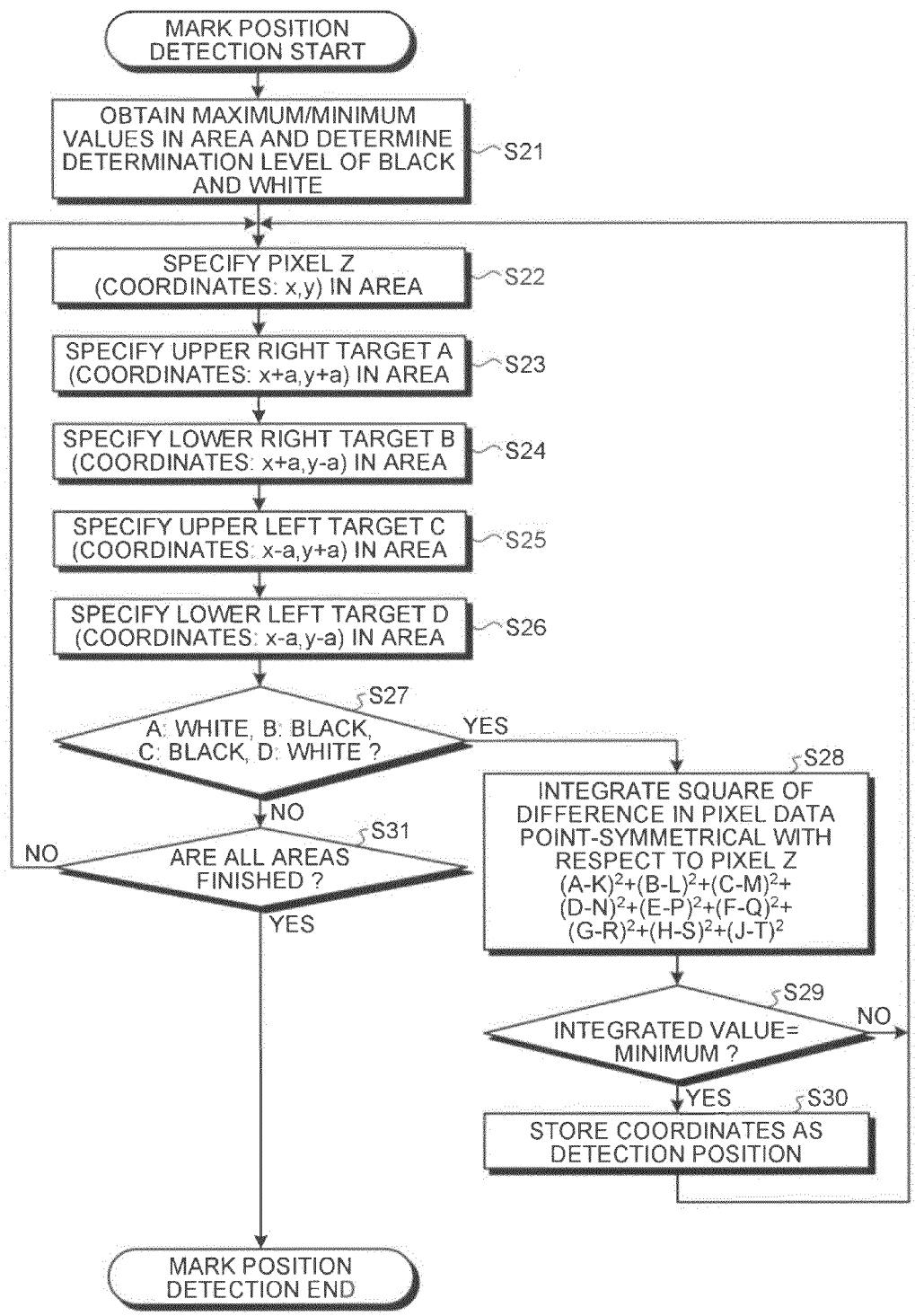
FIG. 6 is a flowchart illustrating a specific process of the mark position detecting method in FIG. 4.

FIG. 6 is a flowchart illustrating a specific process of the mark position detecting method in FIG. 4.

In FIG. 6, the maximum value and the minimum value of the concentration in the detection area specified at Step S9 in FIG. 4 are obtained and a determination level of black and white is determined (Step S21).

Then, it is determined whether pixels A and D are white and pixels B and C are black (Step S27), and when the pixels A and D are not white and the pixels B and C are not black, the above process is repeated by changing the specified position of a pixel Z until the pixels A and D become white and the pixels B and C become black (Step S31).

Then, when the pixels A and D become white and the pixels B and C become black, the square of the difference in concentration data between pixels that are point-symmetrical with respect to the pixel Z is integrated (Step S28). Then, the integrated value at this time is compared with the previously calculated integrated value (Step S29), and when the integrated value at this time is minimal, (coordinates: x,y) of the pixel Z at this time is stored (Step S30). The above process is repeated until all pixels in the detection area are specified as the pixel Z (Step S31).

Figure 7A:
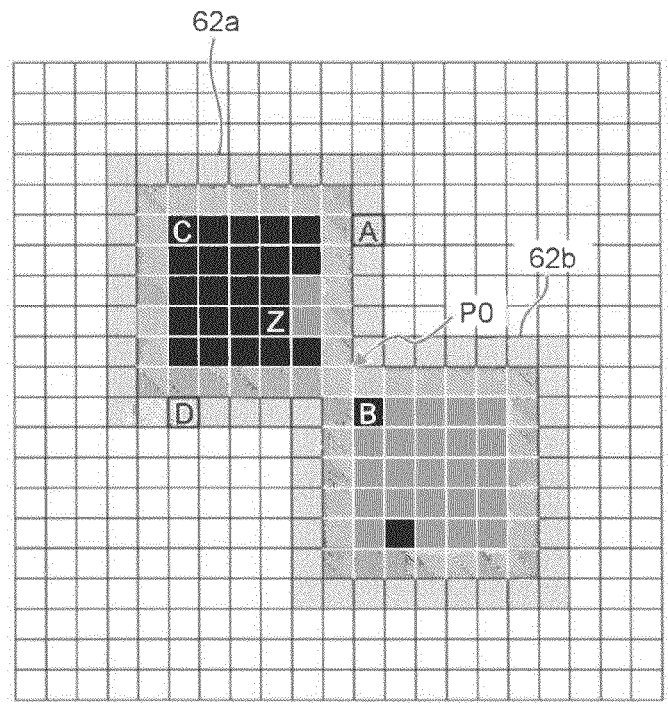
FIG. 7A and FIG. 7B are diagrams illustrating pixels to be an integration target at the time when a pixel at a position different from a mark position is specified in the mark position detecting method in FIG. 6.
Figure 7B:
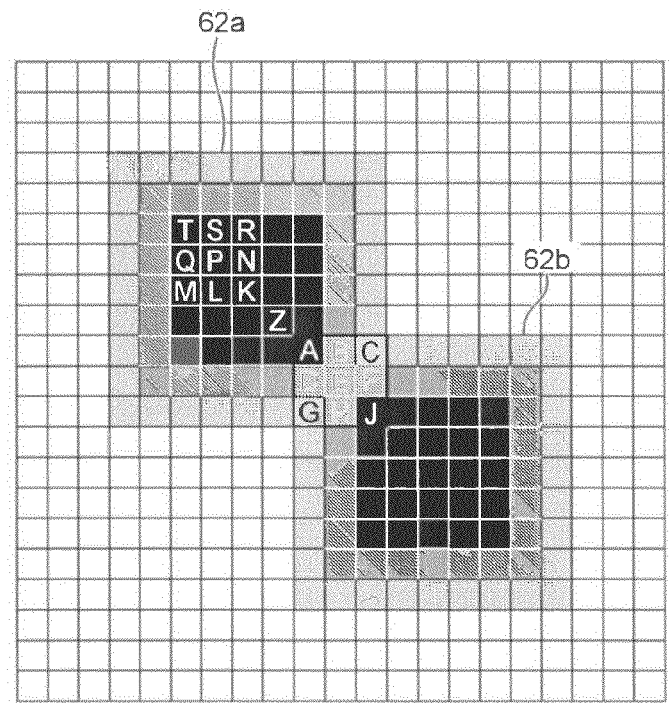

FIG. 7A and FIG. 7B are diagrams illustrating pixels to be an integration target at the time when a pixel at a position different from the mark position is specified in the mark position detecting method in FIG. 6.

In FIG. 7A, a pixel at a position difference from the mark position PO is specified as the pixel Z. In this case, as shown in FIG. 7B, pixels K to N and P to T in one of the patterns that are point-symmetrical with respect to the pixel Z are all included in the captured pattern 62a. On the contrary, some of pixels A to H and J in the other of the patterns that are point-symmetrical with respect to the pixel Z are out of the captured pattern 62b.

Therefore, when the square of the difference in the concentration data between pixels of the patterns that are point-symmetrical with respect to the pixel Z at this time is integrated, the integrated value at this time becomes a large value by some of the pixels A to H and J out of the captured pattern 62b.

Figure 8A:
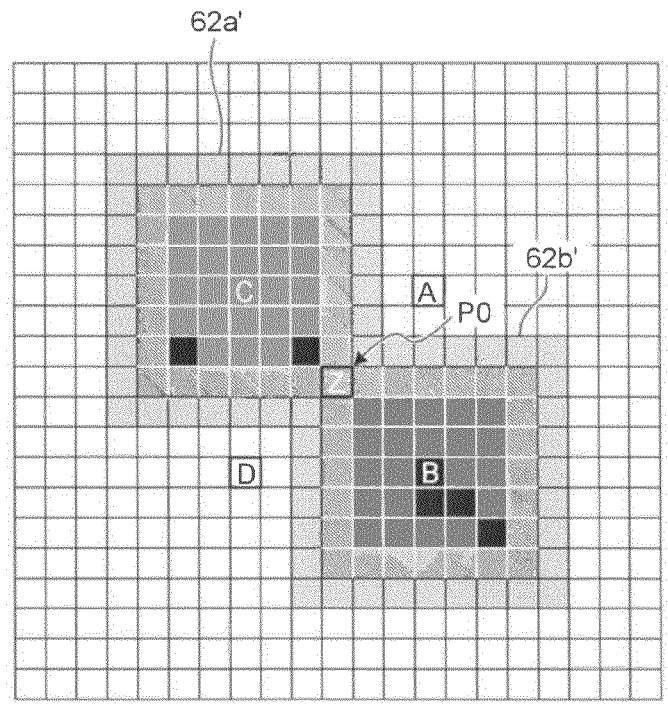
FIG. 8A and FIG. 8B are diagrams illustrating pixels to be an integration target at the time when a pixel at a position matching a mark position is specified in the mark position detecting method in FIG. 6.
Figure 8B:
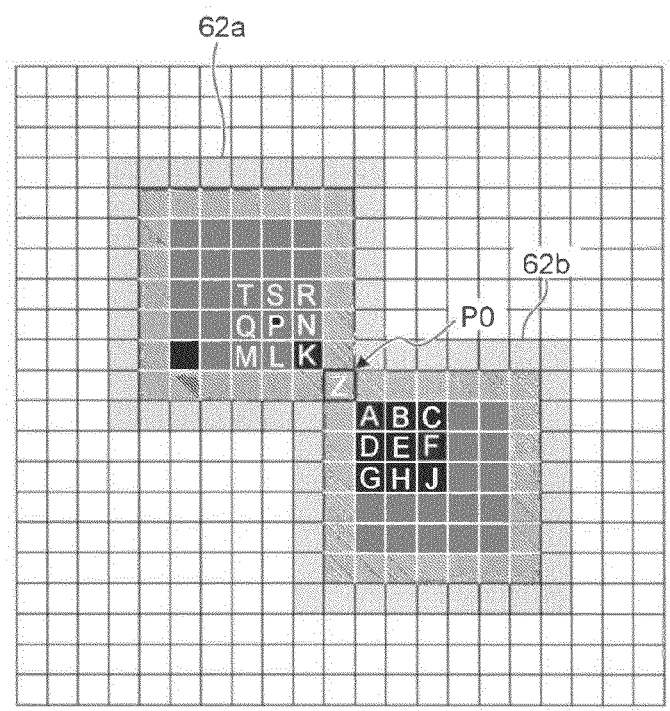

FIG. 8A and FIG. 8B are diagrams illustrating pixels to be an integration target at the time when a pixel at a position matching the mark position is specified in the mark position detecting method in FIG. 6.

In FIG. 8A, a pixel at a position matching the mark position PO is specified as the pixel Z. In this case, as shown in FIG. 8B, the pixels K to N and P to T in one of the patterns that are point-symmetrical with respect to the pixel Z are all included in the captured pattern 62a. Moreover, the pixels A to H and J in the other of the patterns that are point-symmetrical with respect to the pixel Z are all included in the captured pattern 62b.

Therefore, when the square of the difference in the concentration data between pixels of the patterns that are point-symmetrical with respect to the pixel Z at this time is integrated, the integrated value at this time becomes a value that is small compared to the case where some of the pixels A to H and J are out of the captured pattern 62b.

Thus, the mark position of each detection area can be obtained by integrating the square of the difference in the concentration data between pixels that are point-symmetrical with respect to the pixel Z and detecting the position of the pixel Z at which the integrated value at this time becomes minimum.

Figure 9:
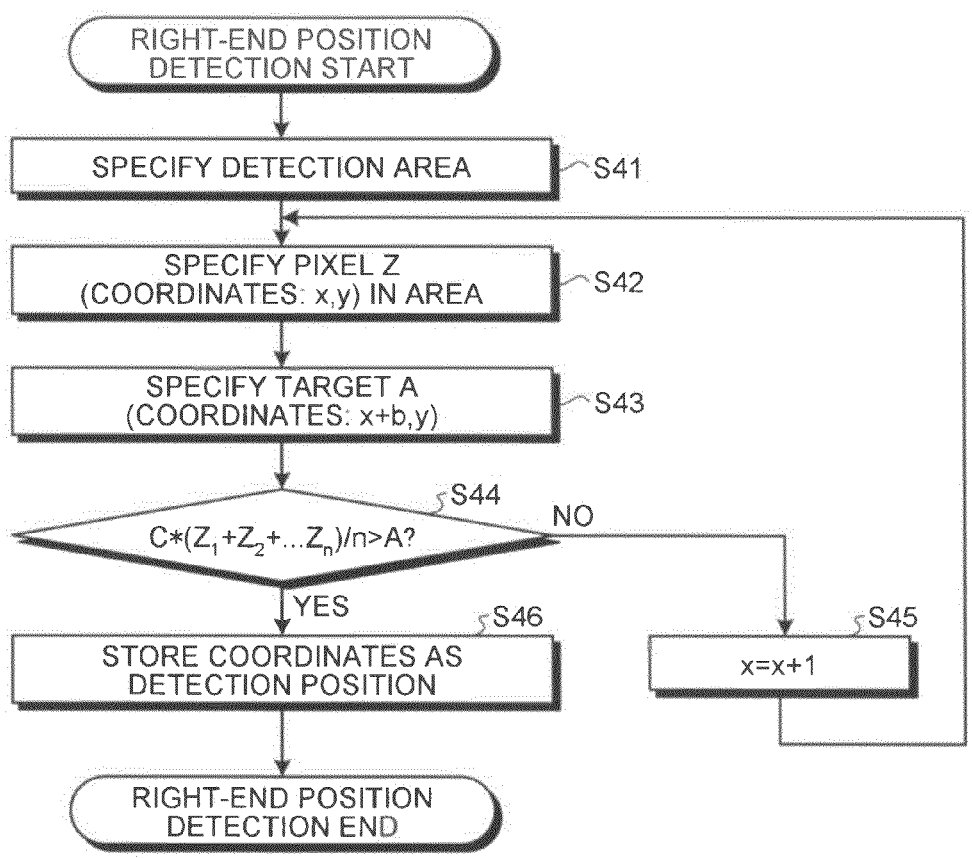
FIG. 9 is a flowchart illustrating a specific process of a right-end position detection of the mark position detecting method in FIG. 4.
Figure 10A:
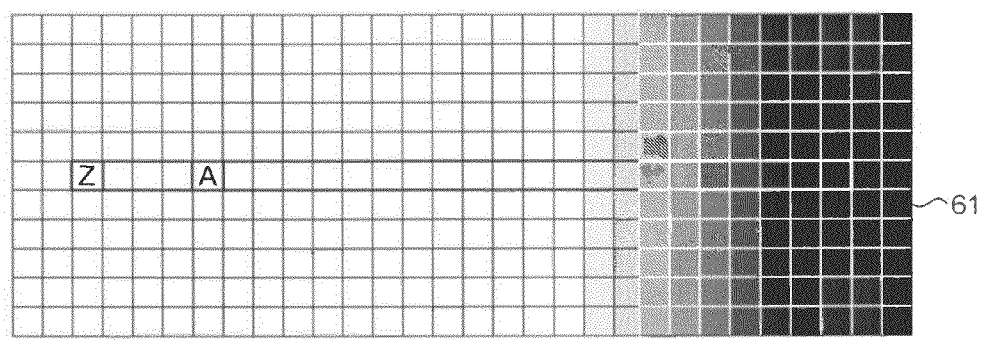
FIG. 10A and FIG. 10B are diagrams illustrating a specifying method of a pixel in the right-end position detection process in FIG. 9.
Figure 10B:
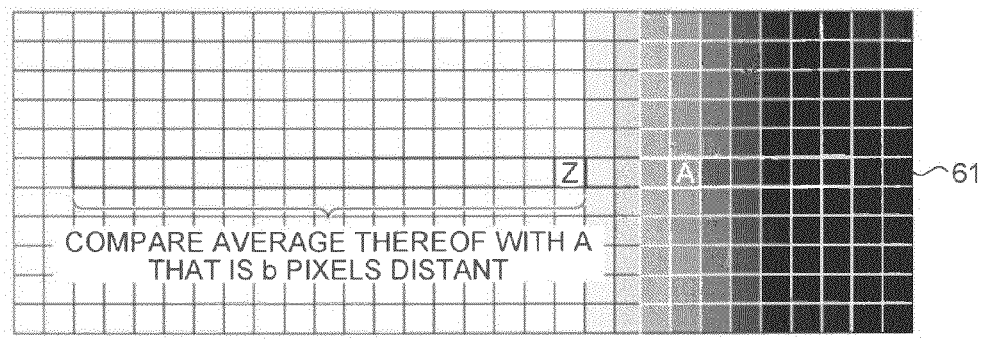

FIG. 9 is a flowchart illustrating a specific process of the right-end position detection of the mark position detecting method in FIG. 4, and FIG. 10A and FIG. 10B are diagrams illustrating a specifying method of a pixel in the right-end position detecting process in FIG. 9.

In FIG. 9, the detection area is set near the right end position P1 (Step S41). The detection area can be set so that a mark is not positioned on the right side of the detection area based on the mark position PO of the center mark and the screen size.

Next, as shown in FIG. 10A, the pixel Z (coordinates: x,y) in the detection area is specified (Step S42). Then, a pixel A (coordinates: x+b,y) on the right side of the pixel Z is specified (Step S43). The symbol b is an index indicating a distance of the pixel A from the pixel Z, and can, for example, be set to b=4.

Next, as shown in FIG. 10B, it is determined whether the value obtained by weighting the average of the concentration data on the pixels Z specified up to that time by weight C is larger than the concentration of the pixel A while shifting the position of the pixel Z to right by one pixel (Steps S44 and S45). The weight C can, for example, be set to 0.6. Then, the coordinates of the pixel Z at the time when the value obtained by weighting the average value of the concentration data on the pixels Z specified up to that time by the weight C becomes larger than the concentration of the pixel A are stored (Step S46).

Figure 11:
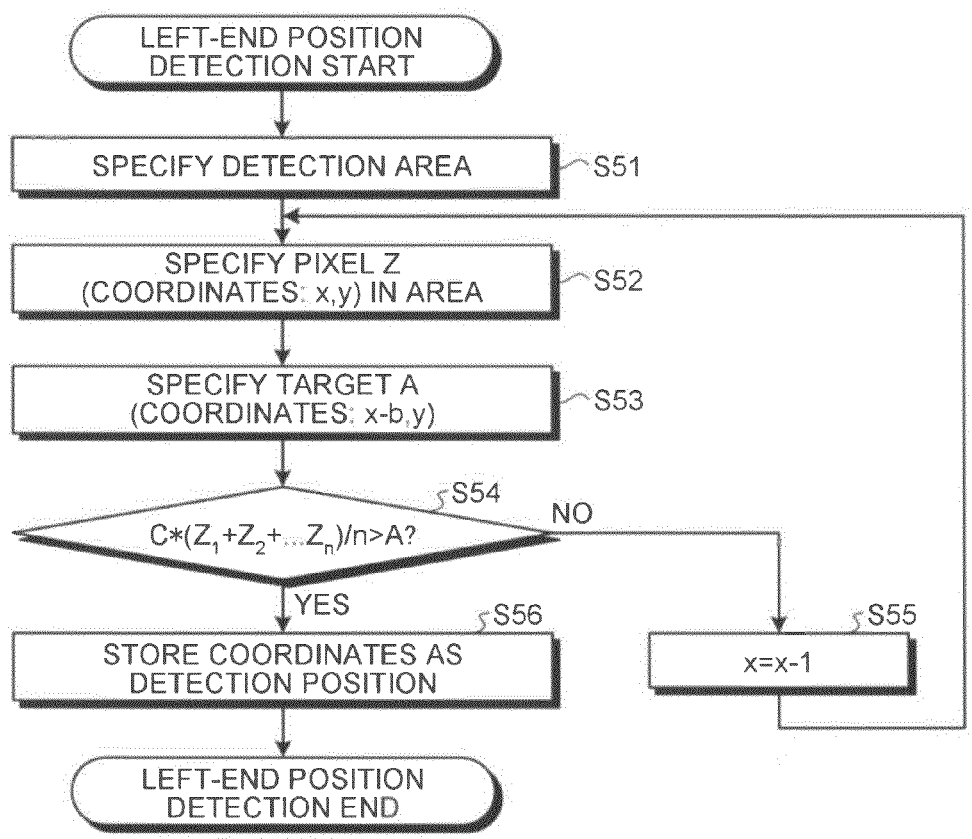
FIG. 11 is a flowchart illustrating a specific process of a left-end position detection of the mark position detecting method in FIG. 4.

FIG. 11 is a flowchart illustrating a specific process of the left-end position detection of the mark position detecting method in FIG. 4.

In FIG. 11, the detection area is set near the left end position P2 (Step S51). The detection area can be set so that a mark is not positioned on the left side of the detection area based on the mark position PO of the center mark and the screen size.

Next, the pixel Z (coordinates: x,y) in the detection area is specified (Step S52). Then, a pixel A (coordinates: x-b,y) on the left side of the pixel Z is specified (Step S53). The symbol b can, for example, be set to b=4.

Next, it is determined whether the value obtained by weighting the average of the concentration data on the pixels Z specified up to that time by the weight C is larger than the concentration of the pixel A while shifting the position of the pixel Z to left by one pixel (Steps S54 and S55). The weight C can, for example, be set to 0.6. Then, the coordinates of the pixel Z at the time when the value obtained by weighting the average value of the concentration data on the pixels Z specified up to that time by the weight C becomes larger than the concentration of the pixel A are stored (Step S56).

Figure 12:
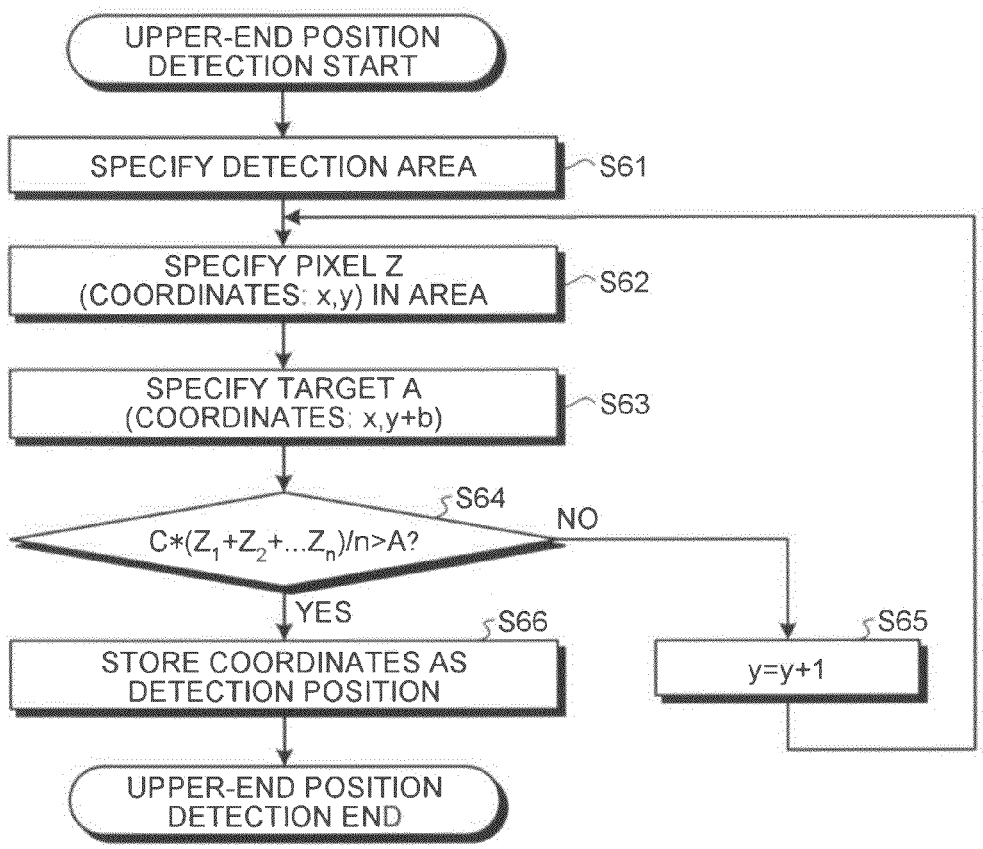
FIG. 12 is a flowchart illustrating a specific process of an upper-end position detection of the mark position detecting method in FIG. 4.

FIG. 12 is a flowchart illustrating a specific process of the upper-end position detection of the mark position detecting method in FIG. 4.

In FIG. 12, the detection area is set near the upper end position P3 (Step S61). The detection area can be set so that a mark is not positioned on the upper side of the detection area based on the mark position PO of the center mark and the screen size.

Next, the pixel Z (coordinates: x,y) in the detection area is specified (Step S62). Then, a pixel A (coordinates: x,y+b) on the upper side of the pixel Z is specified (Step S63). The symbol b can, for example, be set to b=4.

Next, it is determined whether the value obtained by weighting the average of the concentration data on the pixels Z specified up to that time by the weight C is larger than the concentration of the pixel A while shifting the position of the pixel Z upward by one pixel (Steps S64 and S65). The weight C can, for example, be set to 0.6. Then, the coordinates of the pixel Z at the time when the value obtained by weighting the average value of the concentration data on the pixels Z specified up to that time by the weight C becomes larger than the concentration of the pixel A are stored (Step S66).

Figure 13:
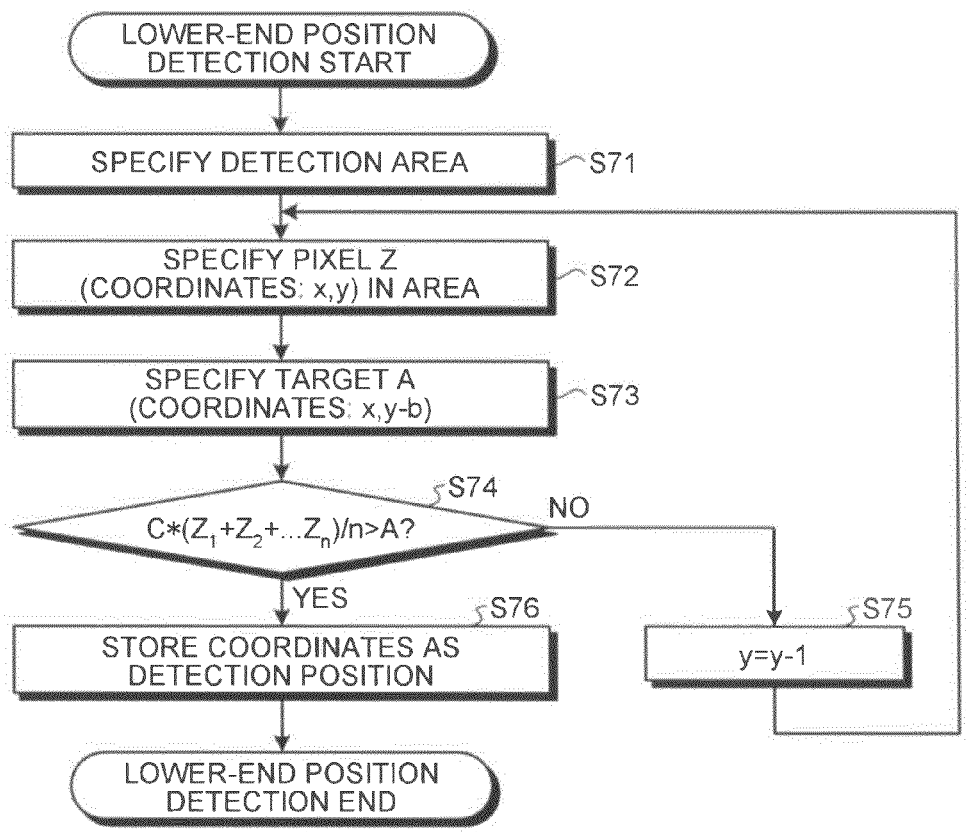
FIG. 13 is a flowchart illustrating a specific process of a lower-end position detection of the mark position detecting method in FIG. 4.

FIG. 13 is a flowchart illustrating a specific process of the lower-end position detection of the mark position detecting method in FIG. 4.

In FIG. 13, the detection area is set near the lower end position pixel P4 (Step S71). The detection area can be set so that a mark is not positioned on the lower side of the detection area based on the mark position PO of the center mark and the screen size.

Next, the pixel Z (coordinates: x,y) in the detection area is specified (Step S72). Then, a pixel A (coordinates: x,y-b) on the lower side of the pixel Z is specified (Step S73). The symbol b can, for example, be set to b=4.

Next, it is determined whether the value obtained by weighting the average of the concentration data on the pixels Z specified up to that time by the weight C is larger than the concentration of the pixel A while shifting the position of the pixel Z downward by one pixel (Steps S74 and S75). The weight C can, for example, be set to 0.6. Then, the coordinates of the pixel Z at the time when the value obtained by weighting the average value of the concentration data on the pixels Z specified up to that time by the weight C becomes larger than the concentration of the pixel A are stored (Step S76).

The mark arranged in the test chart 12' is formed of the first pattern 62a' and the second pattern 62b' that are point-symmetrical to each other and the center point with respect to which the captured patterns 62a and 62b are point-symmetrical is detected, so that even when the captured patterns 62a and 62b blur, the center point can be accurately detected and therefore calculation accuracy of the correction parameter can be improved.

Moreover, a mark arranged in the test chart 12' is formed of the first pattern 62a' and the second pattern 62b' that are point-symmetrical to each other, so that the marks used for detecting the center point can be discretely arranged in the test chart 12'. Therefore, it is not needed to scan a pixel from one end to the other end of the captured image 12 for detecting the center point, enabling to reduce the load in the process.

(Second Embodiment)

Figure 14:
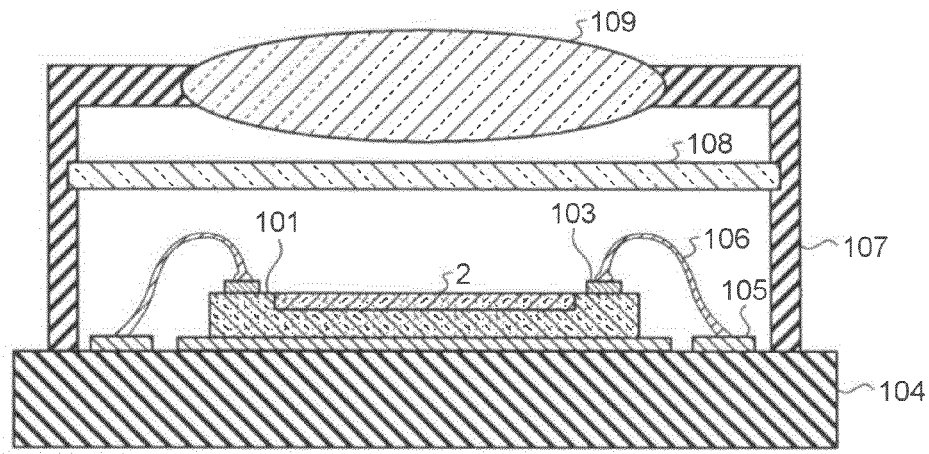
FIG. 14 is a cross-sectional view illustrating a schematic configuration of a solid-state imaging device according to a second embodiment.

FIG. 14 is a cross-sectional view illustrating a schematic configuration of a solid-state imaging device according to the second embodiment.

In FIG. 14, the image sensor 2 is formed in a semiconductor chip 101 and a pad electrode 103 is formed around the semiconductor chip 101. It is applicable to form the timing-signal generating circuit 3, the A/D converter 4, the signal processing circuit 5, the image-position correcting circuit 6, and the video-signal interface circuit 7, the register interface 8, and the correction parameter register 9 in FIG. 1 in the semiconductor chip 101.

On the other hand, a land electrode 105 is formed on a mother board 104. The semiconductor chip 101 is mounted on the mother board 104 and the pad electrode 103 and the land electrode 105 are connected via a bonding wire 106. A mirror tube 107 is arranged on the mother board 104 to surround the semiconductor chip 101. A filter plate 108 and a lens 109 are held above the semiconductor chip 101 by the mirror tube 107 to modularize the semiconductor chip 101, the filter plate 108, and the lens 109.

Then, light from a capturing target enters the image sensor 2 via the lens 109, so that a captured signal is output from the image sensor 2. The correction parameter stored in the correction parameter register 9 in FIG. 1 can be set so that deviation, distortion, and the like of a captured image generated due to the manufacturing variation of the lens 109 and the mirror tube 107, distortion of the lens 109 and variation in attachment position of the lens 109, and the like are eliminated.

(Third Embodiment)

Figure 15:
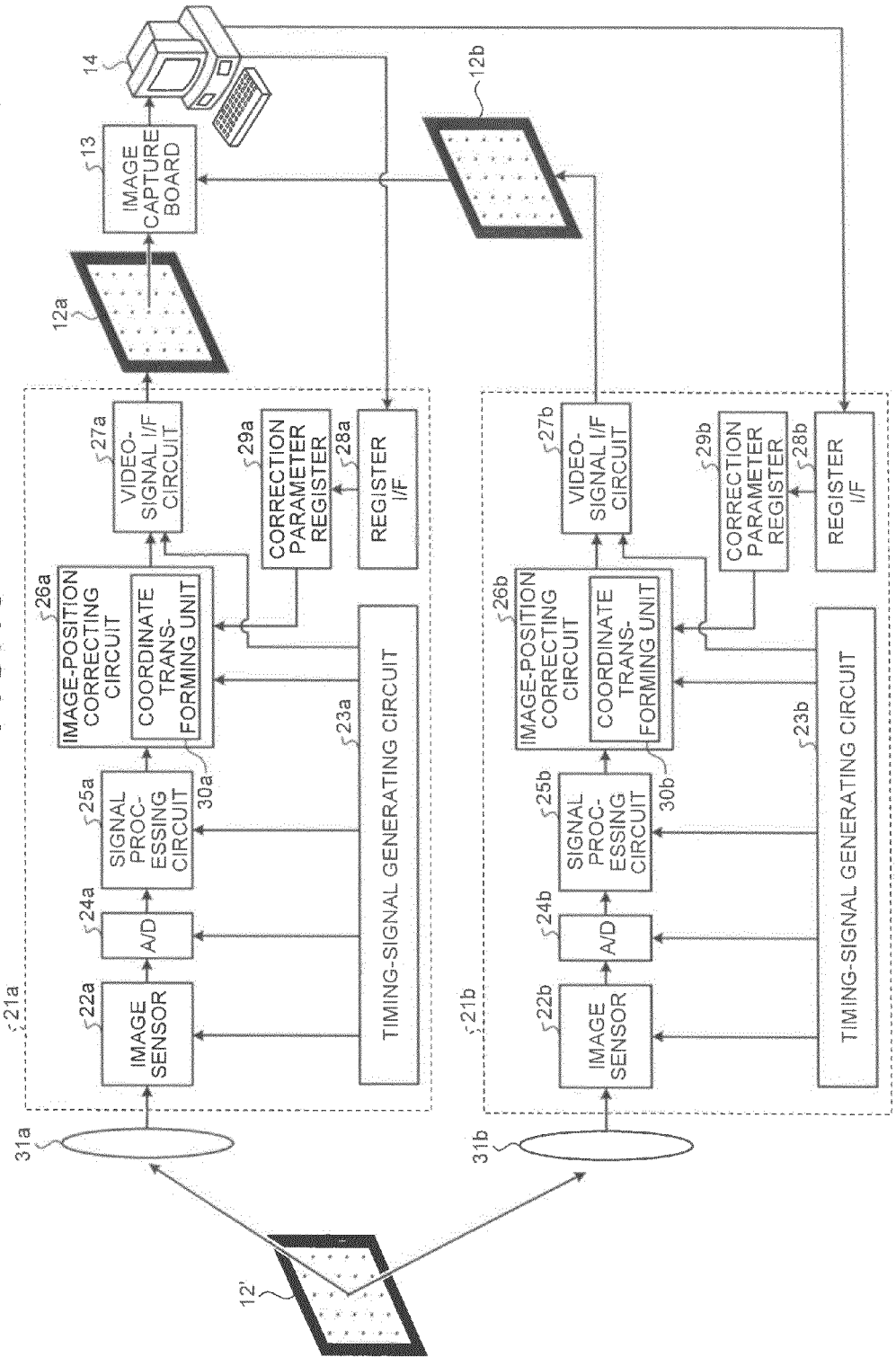
FIG. 15 is a block diagram illustrating a schematic configuration of a solid-state imaging device according to a third embodiment.

FIG. 15 is a block diagram illustrating a schematic configuration of a solid-state imaging device according to the third embodiment.

In FIG. 15, a solid-state imaging device 21a includes an image sensor 22a, a timing-signal generating circuit 23a, an A/D converter 24a, a signal processing circuit 25a, an image-position correcting circuit 26a, a video-signal interface circuit 27a, a register interface 28a, and a correction parameter register 29a. The image-position correcting circuit 26a includes a coordinate transforming unit 30a. A lens 31a is arranged in front of the image sensor 22a.

A solid-state imaging device 21b includes an image sensor 22b, a timing-signal generating circuit 23b, an A/D converter 24b, a signal processing circuit 25b, an image-position correcting circuit 26b, a video-signal interface circuit 27b, a register interface 28b, and a correction parameter register 29b. The image-position correcting circuits 26a and 26b include the coordinate transforming units 30a and 30b, respectively, which perform a coordinate transformation on a position of a captured image based on the correction parameter for each pixel.

The solid-state imaging devices 21a and 21b can be operated in the similar manner to the solid-state imaging device 1 in FIG. 1. In the case of storing the correction parameter in the correction parameter registers 29a and 29b, one test chart 12' can be captured simultaneously by the image sensors 22a and 22b.

In the correction parameter register 29a, the correction parameter calculated with respect to a captured image 12a captured by the image sensor 22a is stored. Then, in the image-position correcting circuit 26a, the position of the captured image is corrected for each pixel based on the correction parameter stored in the correction parameter register 29a.

Moreover, in the correction parameter register 29b, the correction parameter calculated with respect to a captured image 12b captured by the image sensor 22b is stored. Then, in the image-position correcting circuit 26b, the position of the captured image is corrected for each pixel based on the correction parameter stored in the correction parameter register 29b.

Consequently, even when distortions of the lenses 31a and 31b or the attachment positions of the lenses 31a and 31b are different for each of the solid-state imaging devices 21a and 21b, deviation, distortion, disparity, and the like of captured images output from the solid-state imaging devices 21a and 21b can be corrected in accordance with distortion of each of the lenses 31a and 31b and variation in attachment position of the lenses 31a and 31b, so that even when captured images of the solid-state imaging devices 21a and 21b are synthesized, degradation in quality of the composite image can be reduced.

In the embodiment in FIG. 1, explanation is given for the method of calculating the correction parameter so that the mark position of the test chart 12' becomes a reference; however, it is applicable that the correction parameter is calculated so that the mark position of any one of the captured images 12a and 12b of the solid-state imaging devices 21a and 21b becomes a reference.

(Fourth Embodiment)

Figure 16:
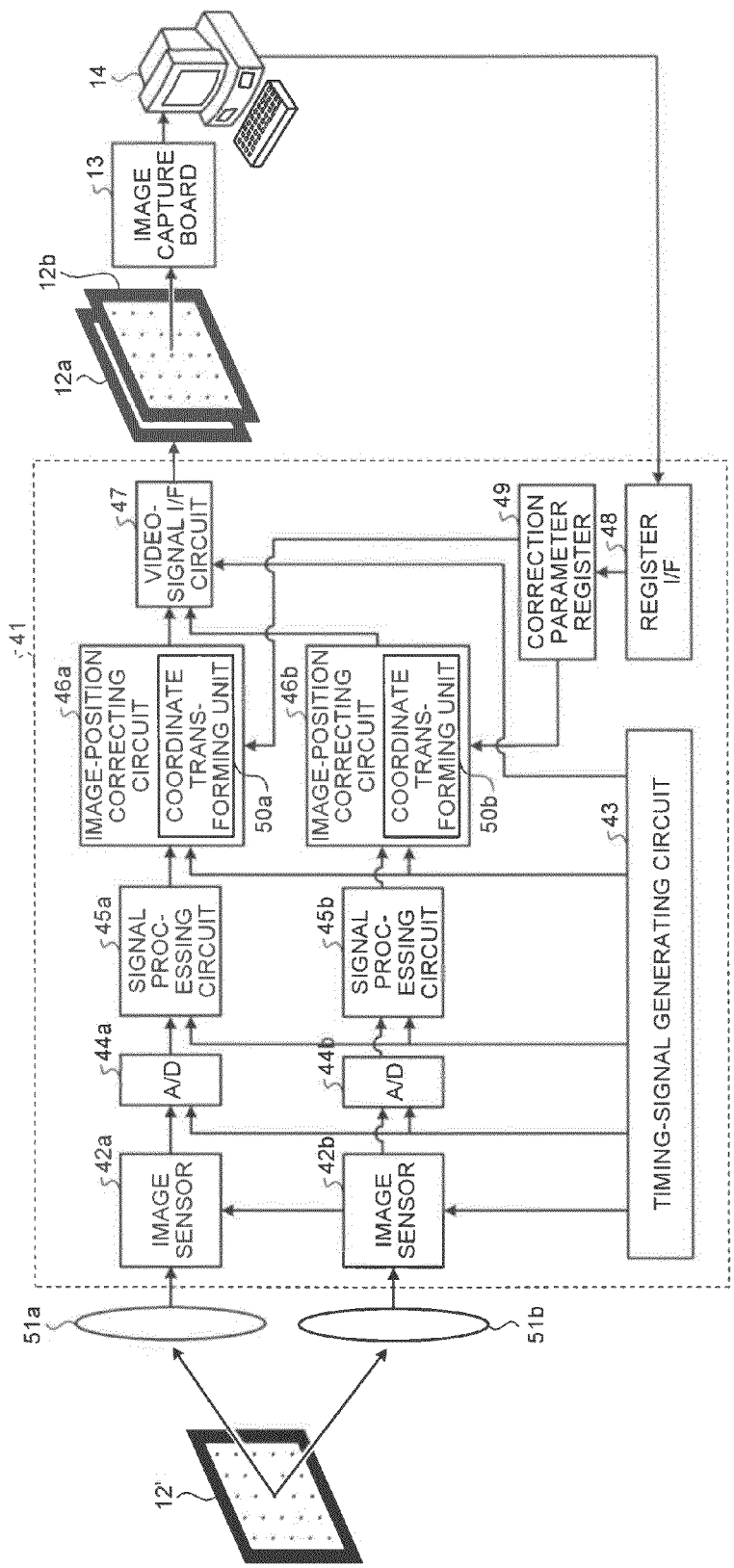
FIG. 16 is a block diagram illustrating a schematic configuration of a solid-state imaging device according to a fourth embodiment.

FIG. 16 is a block diagram illustrating a schematic configuration of a solid-state imaging device according to the fourth embodiment.

In FIG. 16, a solid-state imaging device 41 includes image sensors 42a and 42b, a timing-signal generating circuit 43, A/D converters 44a and 44b, signal processing circuits 45a and 45b, image-position correcting circuits 46a and 46b, a video-signal interface circuit 47, a register interface 48, and a correction parameter register 49. The image-position correcting circuits 46a and 46b include coordinate transforming units 50a and 50b, respectively. Lenses 51a and 51b are arranged in front of the image sensors 42a and 42b, respectively.

The solid-state imaging device 41 can be operated in the similar manner to the solid-state imaging devices 21a and 21b in FIG. 15. In the case of storing the correction parameter in the correction parameter register 49, one test chart 12' can be captured simultaneously by the image sensors 42a and 42b. In the correction parameter register 49, the correction parameter calculated with respect to the captured images 12a and 12b captured by the image sensors 42a and 42b, respectively, is stored.

Consequently, even when distortions of the lenses 51a and 51b or the attachment positions of the lenses 51a and 51b are different for each of the image sensors 42a and 42b, deviation, distortion, disparity, and the like of a plurality of captured images output from the solid-state imaging device 41 can be corrected in accordance with distortion of each of the lenses 51a and 51b and variation in attachment position of the lenses 51a and 51b, so that even when a plurality of captured images of the solid-state imaging device 41 are synthesized, degradation in quality of the composite image can be reduced.

In the embodiment in FIG. 1, explanation is given for the method of calculating the correction parameter so that the mark position of the test chart 12' becomes a reference; however, it is applicable that the correction parameter is calculated so that the mark position of any one of the captured images 12a and 12b of the solid-state imaging device 41 becomes a reference.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
an image sensor configured to capture an image;
a correction-parameter storing unit configured to store therein a correction parameter with which a position of a captured image captured by the image sensor is corrected for each pixel;
an image-position correcting circuit configured to correct the position of the captured image for each pixel based on the correction parameter; and
a video-signal interface circuit configured to output the captured image, wherein,
before the correction parameter is stored in the correction-parameter storing unit, the captured image passes the image-position correcting circuit and is output via the video-signal interface circuit, and then the correction parameter is calculated based on the captured image outputted from the video-signal interface circuit, and wherein,
after the correction parameter is stored in the correction parameter storing unit, the coordinates of the pixels of the captured image are transformed in accordance with the correction parameter stored in the correction parameter storing unit and the corrected captured image is output via the video-signal interface circuit.

2. The solid-state imaging device according to claim 1, wherein the image-position correcting circuit includes a coordinate transforming unit that performs a coordinate transformation on the position of the captured image for each pixel based on the correction parameter.

3. The solid-state imaging device according to claim 2, wherein the correction parameter is an affine transformation matrix or a projective transformation matrix.

4. The solid-state imaging device according to claim 1, wherein the correction parameter is set so that a deviation between a pattern of the captured image captured by the image sensor and a pattern of a capturing target to be captured by the image sensor is eliminated.

5. The solid-state imaging device according to claim 1, wherein the correction parameter is set so that a coordinate of a pattern of the captured image captured by the image sensor matches a coordinate of a pattern of a capturing target to be captured by the image sensor.

6. The solid-state imaging device according to claim 5, wherein the pattern of the capturing target includes
 a first pattern configured to include a pixel adjacent at least in three directions,
 a second pattern configured to be point-symmetrical to the first pattern, and
 an outer frame pattern configured to be arranged around the first pattern and the second pattern.

7. The solid-state imaging device according to claim 6, wherein a pair of the first pattern and the second pattern is arranged in a lateral direction and a longitudinal direction with a predetermined interval inside the outer frame pattern.

8. The solid-state imaging device according to claim 1, further comprising:
 an Analog to Digital converter configured to digitalize a captured signal output from the image sensor;
 a signal processing circuit configured to perform signal processing of the captured signal digitalized by the Analog to Digital converter;
 a register interface configured to receive the correction parameter stored in the correction-parameter storing unit from outside; and
 a timing-signal generating circuit configured to generate a timing signal so that the image sensor, the Analog to Digital converter, the signal processing circuit, the image-position correcting circuit, and the video-signal interface circuit are capable of operating in a cooperative manner.

9. The solid-state imaging device according to claim 1, further comprising:
 a lens that makes light to enter the image sensor; and
 a lens tube that integrally holds the image sensor and the lens.

10. The solid-state imaging device according to claim 9, wherein the correction parameter is set so that deviation or distortion of the captured image that is generated due to a manufacturing variation of the lens or the lens tube, or distortion of the lens or variation in an attachment position of the lens is eliminated.

* * * * *